(12) United States Patent
Kim et al.

(10) Patent No.: US 12,255,262 B2
(45) Date of Patent: Mar. 18, 2025

(54) METHOD FOR MANUFACTURING SOLAR CELL

(71) Applicant: JUSUNG ENGINEERING CO., LTD., Gwangju-si (KR)

(72) Inventors: JungBae Kim, Gwangju-si (KR);
JunYoung Kang, Gwangju-si (KR);
HyangJu Mun, Gwangju-si (KR);
SeonKi Min, Gwangju-si (KR);
JeongHo Seo, Gwangju-si (KR);
WonSuk Shin, Gwangju-si (KR);
HyunKyo Shin, Gwangju-si (KR);
YoungTae Yoon, Gwangju-si (KR);
KyoungJin Lim, Gwangju-si (KR);
Chul Joo Hwang, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 726 days.

(21) Appl. No.: 17/438,416

(22) PCT Filed: Apr. 7, 2020

(86) PCT No.: PCT/KR2020/004684
§ 371 (c)(1),
(2) Date: Sep. 10, 2021

(87) PCT Pub. No.: WO2020/246698
PCT Pub. Date: Dec. 10, 2020

(65) Prior Publication Data
US 2022/0149224 A1    May 12, 2022

(30) Foreign Application Priority Data

Jun. 3, 2019  (KR) .................. 10-2019-0065440
Jun. 4, 2019  (KR) .................. 10-2019-0065820
Jun. 4, 2019  (KR) .................. 10-2019-0065826

(51) Int. Cl.
*H01L 31/18* (2006.01)
*H01L 31/0445* (2014.01)
(Continued)

(52) U.S. Cl.
CPC ........ *H01L 31/186* (2013.01); *H01L 31/0445* (2014.12); *H01L 31/0465* (2014.12); *H01L 31/0504* (2013.01); *H01L 31/1876* (2013.01)

(58) Field of Classification Search
CPC ............... H01L 31/186; H01L 31/0465; H01L 31/0504; H01L 31/1876; H01L 31/0445
See application file for complete search history.

(56) References Cited

U.S. PATENT DOCUMENTS 11,502,213 B2 *  11/2022  Rim .................... H01L 31/1804
2005/0126619 A1   6/2005  Abe et al.
(Continued)

FOREIGN PATENT DOCUMENTS

CN     108281503 A    7/2018
JP     2001250800 A   9/2001
(Continued)

*Primary Examiner* — David Vu
*Assistant Examiner* — Brandon C Fox
(74) *Attorney, Agent, or Firm* — Renaissance IP Law Group LLP

(57) ABSTRACT

The present invention relates to a method for manufacturing a solar cell, comprising: a seating process of seating, in a processing space for manufacturing a solar cell, a cell in which a plurality of thin film layers are formed; a coating process of spraying a conductive material onto the cell; and a scribing process of irradiating a laser toward the cell to form a cell separation unit for separating the cell into a plurality of unit cells.

16 Claims, 17 Drawing Sheets

(51) Int. Cl.
*H01L 31/0465* (2014.01)
*H01L 31/05* (2014.01)

(56) References Cited

U.S. PATENT DOCUMENTS

| | | |
|---|---|---|
| 2016/0158890 A1 | 6/2016 | Gonzalez et al. |
| 2016/0163912 A1 | 6/2016 | Gonzalez et al. |
| 2017/0155012 A1 | 6/2017 | Beckett et al. |
| 2017/0323808 A1 | 11/2017 | Gislon et al. |
| 2018/0151766 A1 | 5/2018 | Erben et al. |
| 2019/0058078 A1 | 2/2019 | Gislon et al. |
| 2020/0403113 A1* | 12/2020 | Beckett ................ H01L 31/188 |
| 2022/0173261 A1* | 6/2022 | Bettinelli ........ H01L 31/022441 |
| 2022/0271190 A1* | 8/2022 | Jeong ................ H01L 31/0201 |

FOREIGN PATENT DOCUMENTS

| | | | |
|---|---|---|---|
| JP | 2011176148 A | 9/2011 | |
| JP | 2012119602 A | 6/2012 | |
| JP | 2019071446 A | 5/2019 | |
| KR | 20180076197 A | 7/2018 | |
| KR | 20180079228 A | 7/2018 | |
| KR | 20190058060 A | 5/2019 | |
| TW | 201304167 A | 1/2013 | |
| WO | 2017136672 A1 | 8/2017 | |
| WO | WO-2021020657 A1 * | 2/2021 | ............. H01L 21/78 |

* cited by examiner

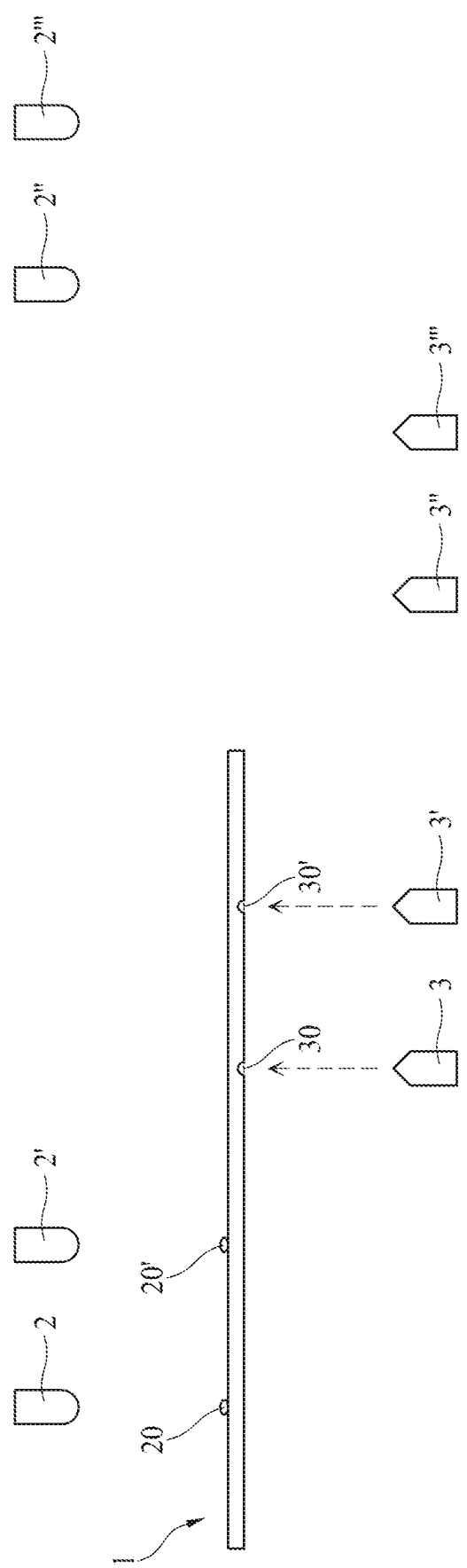

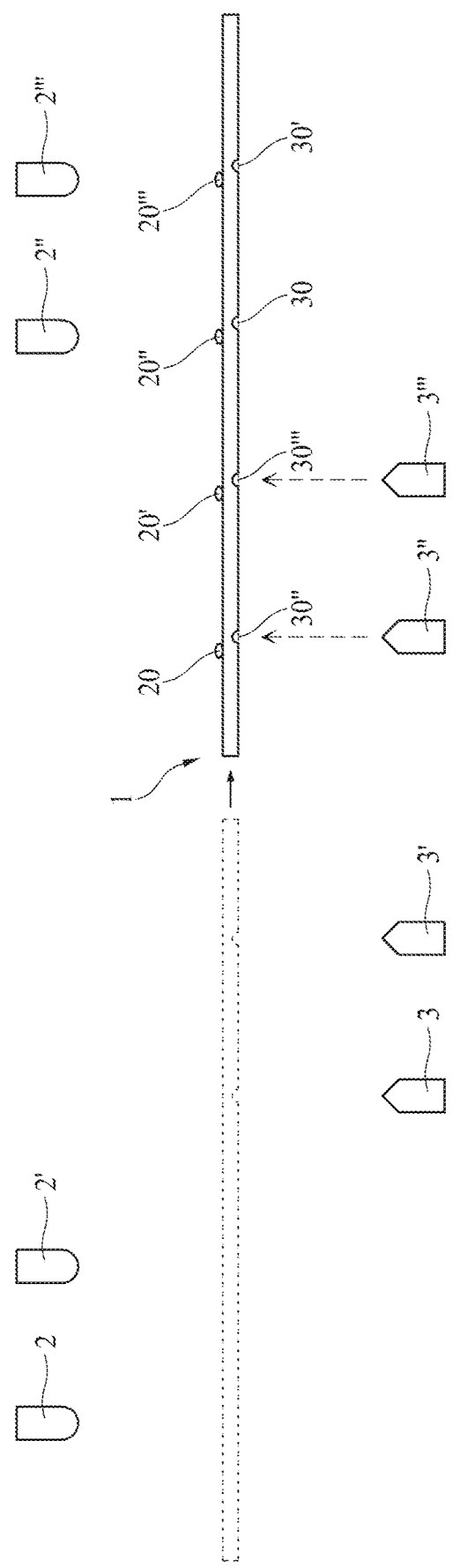

METHOD FOR MANUFACTURING SOLAR CELL

TECHNICAL FIELD

The present invention relates to a solar cell and relates to a solar cell where a wafer type solar cell is combined with a thin film type solar cell.

BACKGROUND ART

Solar cells are devices that convert light energy into electrical energy, based on a characteristic of a semiconductor.

The solar cells have a PN junction structure where a positive (P)-type semiconductor and a negative (N)-type semiconductor are joined to each other. When sunlight is incident on a solar cell having the PN junction structure, a hole and an electron are generated in the semiconductors by energy of the incident sunlight. At this time, due to an electric field which is generated in a PN junction, the hole (+) moves to the P-type semiconductor, and the electron (−) moves to the N-type semiconductor, thereby generating an electric potential to produce power.

The solar cells may be categorized into thin film type solar cells and wafer type solar cells.

The wafer type solar cells are solar cells which are manufactured by using, as a substrate, a semiconductor material such as a silicon wafer, and the thin film type solar cells are solar cells which are manufactured by forming, as a thin film type, a semiconductor on a substrate such as glass.

The wafer type solar cells have an advantage which is better in efficiency than the thin film type solar cells, but the thin film type solar cells have an advantage where the manufacturing cost is reduced compared to the wafer type solar cells.

Therefore, a solar cell where the wafer type solar cell is combined with the thin film type solar cell has been proposed. Hereinafter, a related art solar cell will be described with reference to the drawing.

FIGS. 1A to 1D are schematic side views illustrating a method of manufacturing a solar cell according to the related art.

First, a mounting process of mounting a cell 100, where a plurality of thin film layers are formed, in a processing space (not shown) for manufacturing a solar cell is performed. The processing space may be wholly implemented as a chamber.

Subsequently, as illustrated in FIG. 1A, a scribing process of irradiating a laser toward the cell 100 is performed. As the scribing process is performed, a cell division part 200 for dividing the cell 100 into a plurality of unit cells 100a may be formed. The scribing process may be performed by a scribing apparatus 200a which irradiates the laser onto the cell 100.

Subsequently, as illustrated in FIG. 1B, a print process of printing a conductive material 300 onto the cell 100 is performed. As the print process is performed, the conductive material 300 may be printed onto the cell 100. The print process may be performed by a conductive material printer 300a which prints the conductive material 300 onto the cell 100.

Subsequently, as illustrated in FIG. 1C, a cutting process of dividing the cell 100 into the plurality of unit cells 100a is performed. As the cutting process is performed, the cell 100 may be divided into the plurality of unit cells 100a through the cell division part 200. As illustrated in FIG. 1C, in a case which desires to divide the cell 100 into five unit cells 100a, 100a', 100a'', 100a''', and 100a'''', the cutting process may be performed four times.

Subsequently, as illustrated in FIG. 1D, a bonding process of bonding divided unit cells 100a, 100a', 100a'', 100a''', and 100a'''' is performed. The bonding process may be performed by bonding the divided unit cells 100a by using the conductive material 300.

Subsequently, a curing process of curing bonded unit cells 100a, 100a', 100a'', 100a''', and 100a'''' is performed. Therefore, a solar cell 1000 having a module type where the unit cells 100a are connected to one another may be manufactured.

In such a method of manufacturing a solar cell, it is urgently needed to develop technology for improving the quality of a solar cell, a manufacturing time of the solar cell, and the manufacturing cost of the solar cell.

DISCLOSURE

Technical Problem

The present invention is devised to solve the above-described problems and is to provide a method of manufacturing a solar cell, which may improve the quality of the solar cell, a manufacturing time of the solar cell, and the manufacturing cost of the solar cell.

Technical Solution

The present invention may include the following elements, for solving the above-described technical problem.

A method of manufacturing a solar cell according to the present invention may include a mounting process of mounting a cell, where a plurality of thin film layers are formed, in a processing space for manufacturing a solar cell, a print process of printing a conductive material onto the cell, and a scribing process of irradiating a laser toward the cell to form a cell division part for dividing the cell into a plurality of unit cells.

In the method of manufacturing the solar cell according to the present invention, the print process may be performed before the scribing process is performed.

In the method of manufacturing the solar cell according to the present invention, the print process and the scribing process may be performed simultaneously.

A method of manufacturing a solar cell according to the present invention may include a mounting process of mounting a cell, where a plurality of thin film layers are formed, in a processing space for manufacturing a solar cell, a scribing process of irradiating a laser onto the cell to form "N−1" (where N is an integer of 3 or more) number of cell division parts for dividing the cell into N number of unit cells, a print process of printing a conductive material onto the cell, a cutting process of dividing the cell into two unit cells, and a bonding process successively performed immediately after the cutting process, for bonding two divided unit cells. The cutting process and the bonding process may be repeatedly performed.

A method of manufacturing a solar cell according to the present invention may include a cutting process of dividing a substrate into two pieces along one cell division part of "N−1" (where N is an integer of 3 or more) number of cell division parts for dividing the substrate into N number of unit pieces and a bonding process of bonding two divided pieces. Each of the cutting process and the bonding process may be repeatedly performed "N−1" times.

Advantageous Effect

According to the present invention, the following effects are obtained.

According to an embodiment of the present invention, a bonding force of a conductive material may increase, and thus, a degree of completion of a bonding process may be enhanced. Also, according to an embodiment of the present invention, a possibility that a crack occurs in a cell may be reduced, thereby enhancing the quality of a finished solar cell.

According to another embodiment of the present invention, a manufacturing time of a solar cell may decrease, and thus, a productivity of the solar cell may be enhanced. Also, according to an embodiment of the present invention, the cost of facilities needed for manufacturing a solar cell may be reduced, thereby decreasing the manufacturing cost of the solar cell.

According to another embodiment of the present invention, a time taken in a bonding process may decrease, thereby enhancing a productivity of a solar cell.

DESCRIPTION OF DRAWINGS

FIGS. 8A and 8B are schematic process side views illustrating an embodiment of a method of manufacturing a solar cell according to a second embodiment of the present invention.

MODE FOR INVENTION

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship. In describing a position relationship, for example, when a position relation between two parts is described as 'on~', 'over~', 'under~', and 'next~', one or more other parts may be disposed between the two parts unless 'just' or 'direct' is used. In describing a time relationship, for example, when the temporal order is described as 'after~', 'subsequent~', 'next~', and 'before~', a case which is not continuous may be included unless 'just' or 'direct' is used.

Hereinafter, an embodiment of a method of manufacturing a solar cell according to the present invention will be described in detail with reference to the accompanying drawings.

The method of manufacturing a solar cell according to the present invention is for manufacturing a solar cell which converts light energy of sunlight into electrical energy. The method of manufacturing a solar cell according to the present invention may be used to manufacture a wafer type solar cell and a thin film type solar cell. Hereinafter, an embodiment where a wafer type solar cell is manufactured by the method of manufacturing a solar cell according to the present invention will be described, but it is obvious to those skilled in the art that a thin film type solar cell is manufactured by the method of manufacturing a solar cell according to the present invention.

Figure 1A:
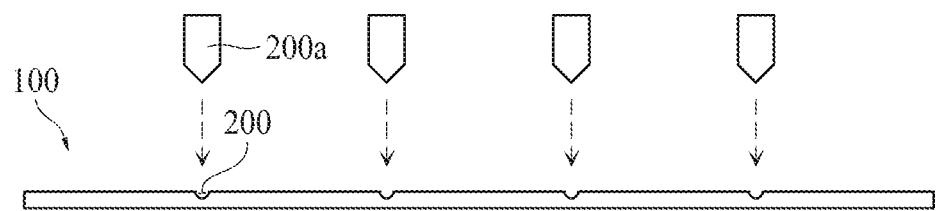
FIGS. 1A to 1D are schematic process side views illustrating a method of manufacturing a solar cell according to the related art.
Figure 1B:
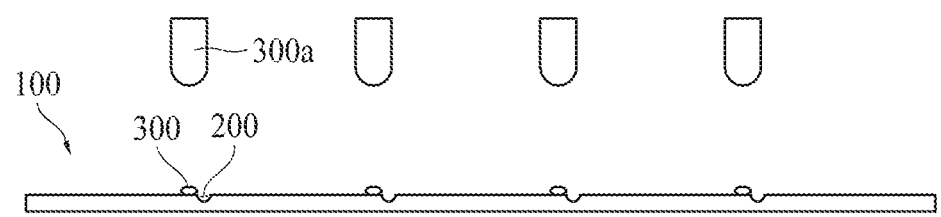
Figure 1C:
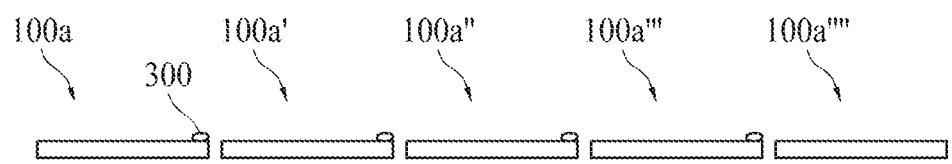
Figure 1D:
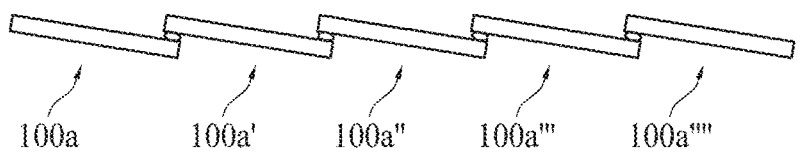
Figure 2:
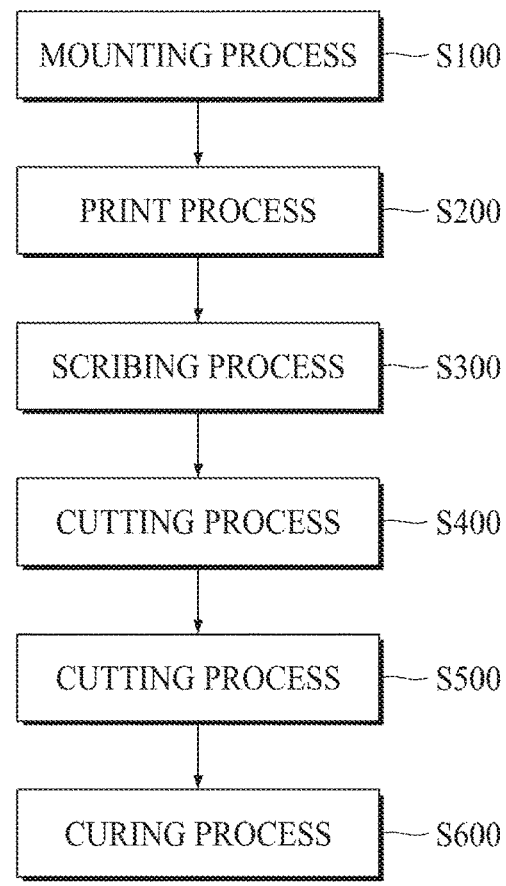
FIG. 2 is a schematic flowchart of a method of manufacturing a solar cell according to the present invention.
Figure 3A:
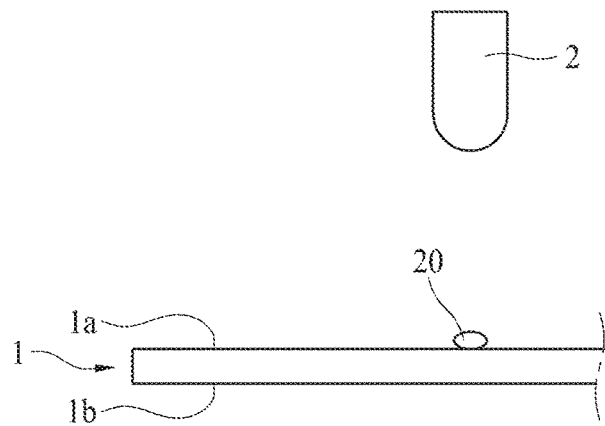
FIGS. 3A and 3B are schematic process side views illustrating a print process and a scribing process in a method of manufacturing a solar cell according to the present invention.
Figure 3B:
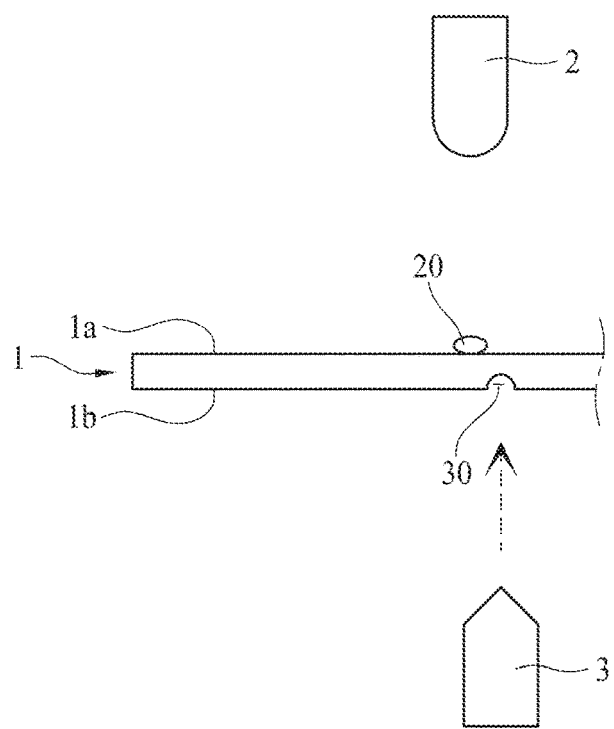
Figure 4:
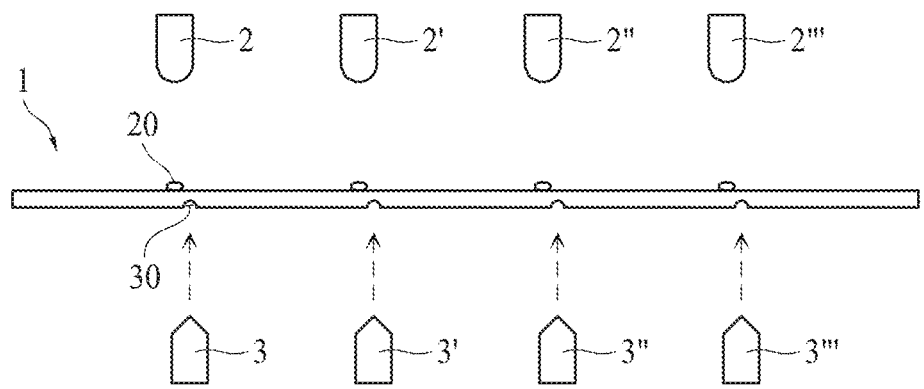
FIG. 4 is a schematic process side view illustrating an example a method of manufacturing a solar cell according to the present invention is performed by a plurality of conductive material printers and a plurality of scribing apparatuses.

Referring to FIGS. 2 to 4, the method of manufacturing a solar cell according to the present invention may include a mounting process (S100) of mounting a cell 1, where a plurality of thin film layers are formed, in a processing space for manufacturing a solar cell, a print process (S200) of printing a conductive material 20 onto the cell 1, and a scribing process (S300) of irradiating a laser toward the cell 1 to form a cell division part 30 for dividing the cell 1 into a plurality of unit cells 10.

The method of manufacturing a solar cell according to the present invention may include a cell manufacturing process of forming the plurality of thin film layers on a substrate before the mounting process (S100) is performed. Before describing the mounting process (S100), the print process (S200), and the scribing process (S300), the cell manufacturing process will be described in detail with reference to the accompanying drawings.

The cell manufacturing process is a process of forming the plurality of thin film layers on the substrate having a conductive polarity. The cell 1 denotes that the plurality of thin film layers are stacked on the substrate. When sunlight is incident on the cell 1, a hole and an electron are generated in the cell 1 by energy of the incident sunlight. When a potential difference occurs in the cell 1 on the basis of movements of the hole and the electron, a solar cell manufactured by the method of manufacturing a solar cell according to the present invention may generate power. As the cell manufacturing process is performed, the plurality of thin film layers may be stacked on the substrate.

The cell manufacturing process may include the following process.

First, the substrate is prepared. The substrate may include a silicon wafer, and in detail, may include an N-type silicon wafer or a P-type silicon wafer. Although not shown, a top surface and a bottom surface of the substrate may have a concave-convex structure, and in this case, each of layers formed on the top surface and the bottom surface of the substrate is formed in a concave-convex structure in a below-described process.

Subsequently, a first thin film layer is formed on the substrate. The first thin film layer may be a semiconductor layer which is formed on the substrate as a thin film type. The first thin film layer may form a PN junction along with the substrate. Therefore, when the substrate includes an N-type silicon wafer, the first thin film layer may be formed of a P-type semiconductor layer. The first thin film layer may be formed by using a chemical vapor deposition (CVD) process and the like. The first thin film layer may be formed in a PIN structure where a P-type semiconductor material, an I-type semiconductor material, and an N-type semiconductor material are sequentially stacked. When the first thin film layer is formed in the PIN structure in this manner, the I-type semiconductor material is depleted by the P-type semiconductor material and the N-type semiconductor material, and thus, an electric field is generated therein, whereby a hole and an electron generated by sunlight are drifted by the electric field and are respectively collected in the P-type semiconductor material and the N-type semiconductor material. In a case where the first thin film layer is formed in the PIN structure, it is preferable that the P-type semiconductor material is formed on the first thin film, and then, the I-type semiconductor material and the N-type semiconductor material are formed. The reason is for forming the P-type semiconductor material at a position close to a light receiving surface so as to maximize collection efficiency based on incident light because a drift mobility of a hole is lower than a drift mobility of an electron generally. The method of manufacturing a solar cell according to the present invention may form the first thin film layer to have a stacked type structure. For example, the method of manufacturing a solar cell according to the present invention may form the first thin film layer to have a staked type structure of a tandem [tandem(PIN/PIN)] type or a triple [triple(PIN/PIN/PIN)] type. The first thin film layer may be formed on the top surface of the substrate. The first thin film layer may be formed on each of the top surface of the substrate and the bottom surface of the substrate.

Subsequently, a second thin film layer is formed on the first thin film layer. The second thin film layer may be a transparent conductive layer formed on the first thin film layer. The second thin film layer may protect the first thin film layer, collect carriers (for example, holes (+)) generated in the substrate, and upward move the collected carriers. The second thin film layer may include a transparent conductive material such as indium tin oxide (ITO), ZnOH, ZnO:B, ZnO:Al, $SnO_2$, or $SnO_2$:F. The second thin film layer may be formed of a transparent conductive material such as ZnO, ZnO:B, ZnO:Al, or Ag by using a sputtering process or a metalorganic chemical vapor deposition (MOCVD) process. The second thin film layer has a function of scattering sunlight to allow the sunlight to travel at various angles, thereby increasing a ratio of light re-incident on the first thin film layer. The method of manufacturing a solar cell according to the present invention may not form the second thin film layer and may form only the first thin film layer. That is, the method of manufacturing a solar cell according to the present invention may selectively form the second thin film layer.

Hereinabove, the cell 1 where two thin film layers are formed on the substrate has been described mainly, but this is merely an example and three or more thin film layers may be formed on the substrate.

The cell manufacturing process may include a process of forming an electrode on a substrate. The electrode may be disposed apart from the substrate by a certain interval. The process of forming the electrode may be performed before forming the thin film layer on the substrate. The electrode may be formed on the substrate. For example, the electrode may be formed on each of a top surface of the substrate and a bottom surface of the substrate. The electrode may be formed on the thin film layer. For example, the electrode may be formed on each of a top surface of the thin film layer and a bottom surface of the thin film layer.

After undergoing the cell manufacturing process, the mounting process (S100), the print process (S200), and the scribing process (S300) may be performed. Here, the method of manufacturing a solar cell according to the present invention is implemented according to several embodiments, and hereinafter, therefore, embodiments of the method of manufacturing a solar cell according to the present invention will be sequentially described with reference to the accompanying drawings.

First Embodiment

Referring to FIGS. 2 to 6, a method of manufacturing a solar cell according to a first embodiment of the present invention is implemented so that the print process (S200) is performed before the scribing process (S300) is performed. Accordingly, the method of manufacturing a solar cell according to the first embodiment of the present invention may realize the following effects.

First, as the scribing process (S300) is performed, particles are formed on the cell 1, and in the method of manufacturing a solar cell according to the first embodiment of the present invention, since the print process (S200) is formed prior to the scribing process (S300), the print process (S200) may be performed in a state where the particles generated by the scribing process (S300) are not provided on the cell 1. Therefore, the method of manufacturing a solar cell according to the first embodiment of the present invention may increase a bonding force of the conductive material 20. Accordingly, the method of manufacturing a solar cell according to the first embodiment of the present invention may enhance a degree of completion of a process of bonding the unit cells 10 by using the conductive material 20.

Second, in the method of manufacturing a solar cell according to the first embodiment of the present invention, the conductive material 20 may be previously printed onto a region where the scribing process (S300) is performed, thereby implementing a restraint force for restraining a possibility that a crack occurs in the cell 1 through the conductive material 20. Accordingly, the method of manufacturing a solar cell according to the first embodiment of the present invention may enhance the quality of a finished solar cell.

According to the method of manufacturing a solar cell according to the first embodiment of the present invention, the mounting process (S100), the print process (S200), and the scribing process (S300) may be implemented as follows.

Referring to FIG. 2, the mounting process (S100) may be a process of mounting the cell in the processing space for manufacturing a solar cell. The mounting process may be performed by a loading apparatus (not shown) which loads the cell into the processing space. The processing space may accommodate a manufacturing apparatus (not shown) needed for manufacturing the solar cell therein and may be wholly implemented as a chamber.

Referring to FIGS. 2 to 4, the print process (S200) may be a process of printing the conductive material 20 onto the cell 1. The print process (S200) may be performed after the mounting process (S100). The print process (S200) may be performed by the conductive material printer 2 which prints the conductive material 20. The conductive material printer 2 may print the conductive material 20 onto a print region which is one region of the cell 1. The conductive material 20 may be implemented as a material having conductivity. FIGS. 3A and 3B schematically illustrate an example where one conductive material 20 is printed onto the cell 1. In FIGS. 3A to 4, it is illustrated that the print process (S200) is performed on a top surface 1a of the cell 1, but this is merely an example and the print process (S200) may be performed on a bottom surface 1b of the cell 1.

The print process (S200) may include a process of printing a plurality of conductive materials 20 onto the cell 1. In this case, the process of printing the plurality of conductive materials 20 may be performed by a plurality of conductive material printers 2. For example, as illustrated in FIG. 4, in case which desires to simultaneously print four conductive materials 20 onto the cell 1, the print process (S200) may be performed by four conductive material printers 2, 2', 2", and 2'". Therefore, when a first conductive material printer 2 prints the conductive material 20 onto a first print region of the cell 1, a second conductive material printer 2' may print the conductive material 20 onto a second print region apart from the first print region, a third conductive material printer 2" may print the conductive material 20 onto a third print region apart from each of the first print region and the second print region, and a fourth conductive material printer 2'" may print the conductive material 20 onto a fourth print region apart from each of the first print region, the second print region, and the third print region. In this case, the conductive material printers 2, 2', 2", and 2'" may be disposed apart from one another by a certain interval. Therefore, the method of manufacturing a solar cell according to the first embodiment of the present invention may be implemented so that the print process (S200) is performed on a whole surface of the cell 1. Accordingly, the method of manufacturing a solar cell according to the first embodiment of the present invention may decrease a time taken in the print process (S200). The first print region, the second print region, the third print region, and the fourth print region may be one regions of the top surface 1a of the cell 1.

Referring to FIGS. 2 to 4, the scribing process (S300) may be a process of forming a cell division part 30 for dividing the cell 1 into a plurality of unit cells 10. The scribing process (S300) may be performed after the print process (S200). The scribing process (S300) may be performed by a scribing apparatus 3 which irradiates a laser toward the cell 1. The scribing apparatus 3 may irradiate the laser onto a scribing region which is one region of the cell 1. The scribing region and the print region may be disposed in different regions of the cell 1. An arrow illustrated as a one-dot-dashed line in FIGS. 3B and 4 schematically illustrates the laser irradiated by the scribing apparatus 3. In FIGS. 3B and 4, it is illustrated that the scribing process (S300) is performed on the bottom surface 1b of the cell 1, but this is merely an example and the scribing process (S300) may be performed on the top surface 1a of the cell 1.

The scribing process (S300) may be performed by irradiating the laser toward the cell 1. Therefore, by removing a certain region of the cell 1, the cell division part 30 may be formed. The cell division part 30 may be implemented as a groove which is recessed from a surface of the cell 1 by a certain depth. The cell division part 30 may be formed to extend from one side of the cell 1 to the other side of the cell 1. FIG. 3B illustrates that one cell division part 30 is formed on the cell 1.

The scribing process (S300) may be a process of forming a plurality of cell division parts 30 on the cell 1. In this case, a process of forming the plurality of cell division parts 30 may be performed by a plurality of scribing apparatuses 3. For example, as illustrated in FIG. 4, in case which desires to simultaneously form four cell division parts 30 on the cell 1, the scribing process (S300) may be performed by four scribing apparatuses 3, 3', 3", and 3'". Therefore, when a first scribing apparatus 3 irradiates a laser onto a first scribing region of the cell 1, a second scribing apparatus 3' may irradiate a laser onto a second scribing region apart from the first scribing region, a third scribing apparatus 3" may irradiate a laser onto a third scribing region apart from each of the first scribing region and the second scribing region, and a fourth scribing apparatus 3'" may irradiate a laser onto a fourth scribing region apart from each of the first scribing region, the second scribing region, and the third scribing region. In this case, the scribing apparatuses 3, 3', 3", and 3'" may be disposed apart from one another by a certain interval. Therefore, the method of manufacturing a solar cell according to the first embodiment of the present invention may be implemented so that the scribing process (S300) is performed on a whole surface of the cell 1. Accordingly, the method of manufacturing a solar cell according to the first embodiment of the present invention may decrease a time taken in the scribing process (S300). The first scribing region, the second scribing region, the third scribing region, and the fourth scribing region may be one regions of the bottom surface 1b of the cell 1.

The scribing process (S300) may be performed by irradiating a laser onto the print region. In this case, the scribing process (S300) and the print process (S200) may be performed on the same surface of the cell 1. Therefore, the method of manufacturing a solar cell according to the first embodiment of the present invention may be implemented to irradiate a laser onto a region onto which the conductive material 20 is previously printed, thereby decreasing a possibility that the crack occurs due to the scribing process (S300). Accordingly, the method of manufacturing a solar cell according to the first embodiment of the present invention may enhance the quality of a solar cell.

In a case where the scribing process (S300) is performed to irradiate a laser onto a region onto which where the conductive material 20 is printed, the print process (S200) may be performed by using a transparent conductive film (TCF) so that a laser is irradiated onto the cell 1. Accordingly, the method of manufacturing a solar cell according to the first embodiment of the present invention may decrease a possibility of occurrence of a crack and may implement a transmissive force which enables a laser to pass through the conductive material 20.

Referring to FIGS. 3A to 4, the print process (S200) and the scribing process (S300) may be performed at different positions of the cell 1. For example, in a case where the scribing process (S300) is performed in the first scribing region, the print process (S200) may be performed in the first print region apart from the first scribing region. Accordingly, the method of manufacturing a solar cell according to the first embodiment of the present invention may separate a region, where the print process (S200) is performed, from a region where the scribing process (S300) is performed, thereby implementing a restraint force for restraining that the conductive material 20 is cured due to a temperature of a laser.

The print process (S200) and the scribing process (S300) may be performed at positions which are apart from each other with respect to a first axial direction. The first axial direction may be a direction parallel to a direction in which the scribing apparatus 3 irradiates a laser. Accordingly, the method of manufacturing a solar cell according to the first embodiment of the present invention may separate the region, where the print process (S200) is performed, from the region where the scribing process (S300) is performed.

Referring to FIGS. 3A to 4, the print process (S200) and the scribing process (S300) may be performed at different surfaces of the cell 1. For example, the print process (S200) may be performed on the top surface 1a of the cell 1, and the scribing process (S300) may be performed on the bottom surface 1b of the cell 1. Accordingly, the method of manufacturing a solar cell according to the first embodiment of the present invention may separate a surface, where the print process (S200) is performed, from a surface where the scribing process (S300) is performed, thereby implementing a restraint force for restraining that the conductive material 20 is cured due to the temperature of the laser.

Figure 5:
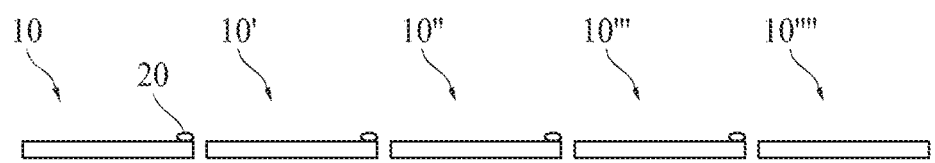
FIG. 5 is a schematic process side view illustrating a cutting process in a method of manufacturing a solar cell according to the present invention.

Referring to FIGS. 2 and 5, the method of manufacturing a solar cell according to the first embodiment of the present invention may include a cutting process (S400) which divides the cell 1 into a plurality of unit cells 10.

The cutting process (S400) may be a process for dividing the cell 1 into the plurality of unit cells 10. The cutting process (S400) may be performed after the scribing process (S300). As illustrated in FIG. 5, in a case which desires to divide the cell 1 into five unit cells 10, 10', 10'', 10''', and 10'''', the method of manufacturing a solar cell according to the first embodiment of the present invention may include a four-time cutting process (S400). That is, in a case which desires to divide the cell 1 into L (where L is an integer of 2 or more) number of unit cells 10, the method of manufacturing a solar cell according to the first embodiment of the present invention may include an (L−1)-time cutting process (S400). As the cutting process (S400) is performed, the cell 1 may be divided into the plurality of unit cells 10 with respect to the cell division part 30. The cutting process (S400) may be performed by a cutting robot (not shown) which divides the cell 1 into the unit cells 10.

Figure 6:
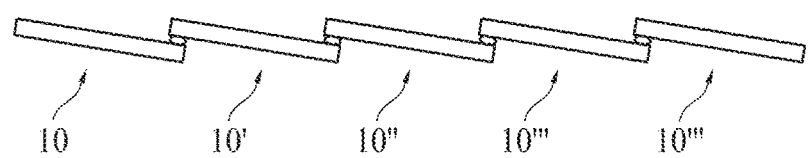
FIG. 6 is a schematic side view illustrating a solar cell on which a bonding process and a curing process have been performed, in a method of manufacturing a solar cell according to the present invention.
Figure 7:
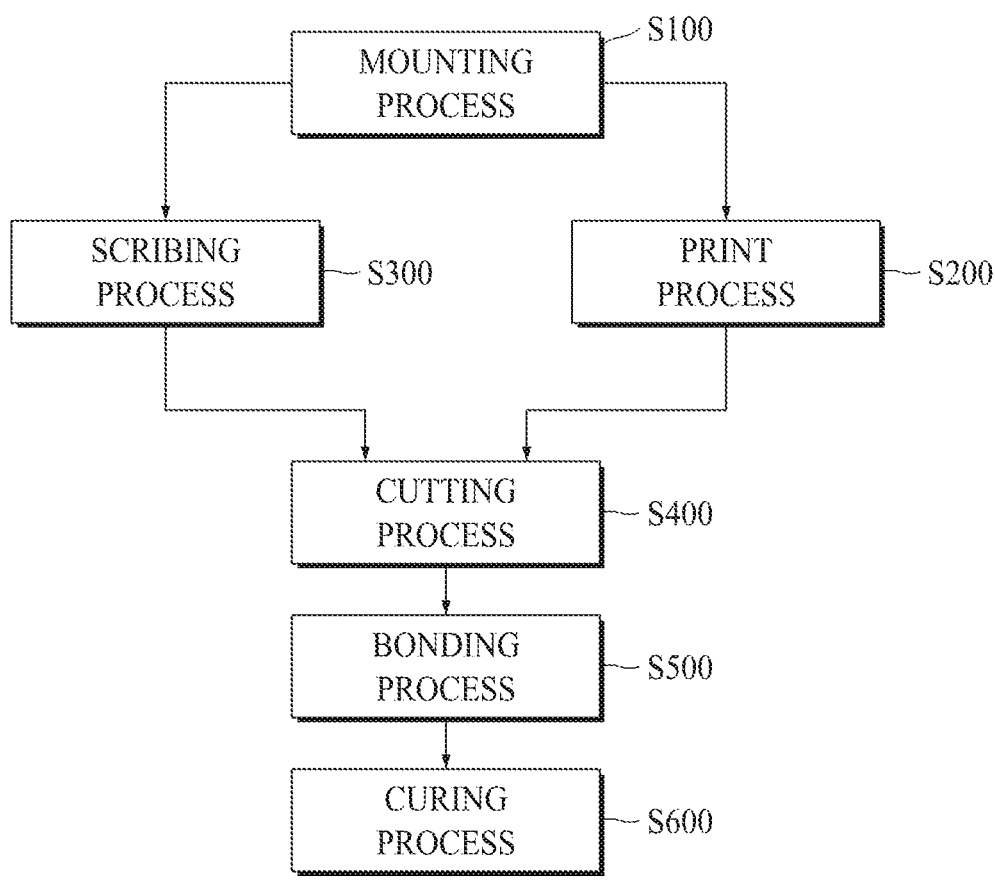
FIG. 7 is a schematic flowchart of a method of manufacturing a solar cell according to a second embodiment of the present invention.

Referring to FIGS. 2 and 6, the method of manufacturing a solar cell according to the first embodiment of the present invention may include a bonding process (S500) which bonds divided unit cells 10.

The bonding process (S500) may be a process of bonding the divided unit cells 10. The bonding process (S500) may be performed by bonding the divided unit cells 10 by using the conductive material 20. The bonding process (S500) may be performed after the cutting process (S400). In a case where the cell 1 is divided into five unit cells 10, 10', 10'', 10''', and 10'''' through the cutting process (S400), as illustrated in FIG. 6, the method of manufacturing a solar cell according to the first embodiment of the present invention may include a four-time bonding process (S500). That is, in a case which desires to bond L number of unit cells 10, the method of manufacturing a solar cell according to the first embodiment of the present invention may include an (L−1)-time bonding process (S500). The bonding process (S500), as illustrated in FIG. 6, may include a process of bonding a top surface of one side of a first unit cell 10 to a bottom surface of one side of a second unit cell 10', a process of bonding a top surface of the other side of the second unit cell 10' to a bottom surface of one side of a third unit cell 10'', a process of bonding a top surface of the other side of the third unit cell 10'' to a bottom surface of one side of a fourth unit cell 10''', and a process of bonding a top surface of the other side of the fourth unit cell 10''' to a bottom surface of one side of a fifth unit cell 10''''. One side and the other side of each of the unit cells 10 may be disposed at positions opposite to each other with respect to a middle point of the unit cell 10. The bonding process (S500) may be performed by a transport robot (not shown) which moves the divided unit cells 10.

Referring to FIGS. 2 and 6, the method of manufacturing a solar cell according to the first embodiment of the present invention may include a curing process (S600).

The curing process (S600) is a process of curing bonded unit cells 10. The curing process (S600) may be performed after the bonding process (S500). The curing process (S600) may be performed by a heating apparatus (not shown) which heats the bonded unit cells 10. As the curing process (S600) is performed, a solar cell 10A having a module type where the unit cells 10 are connected to one another may be manufactured. In FIG. 6, it is illustrated that the solar cell 10A is configured with five unit cells 10, but this is merely an example and the solar cell 10A may be configured with two or more and four or less unit cells 10 or may be configured with six or more unit cells 10.

Second Embodiment

Referring to FIGS. 3B to 8B, a method of manufacturing a solar cell according to a second embodiment of the present invention is implemented so that the print process (S200) and the scribing process (S300) are performed simultaneously. Accordingly, the method of manufacturing a solar cell according to the second embodiment of the present invention may realize the following effects.

First, the method of manufacturing a solar cell according to the second embodiment of the present invention may be implemented so that the print process (S200) and the scribing process (S300) are performed simultaneously, thereby decreasing a time for manufacturing a solar cell. Accordingly, the method of manufacturing a solar cell according to the second embodiment of the present invention may increase a productivity of a solar cell.

Second, the method of manufacturing a solar cell according to the second embodiment of the present invention may be implemented to omit a series of process of transporting the cell 1 between a space where the scribing process (S300) is performed and a space where the print process (S200) is performed. Accordingly, the method of manufacturing a solar cell according to the second embodiment of the present invention may decrease the installation cost of a cell transport means (not shown) used to transport the cell 1, thereby reducing the manufacturing cost of a solar cell.

According to the method of manufacturing a solar cell according to the second embodiment of the present invention, the mounting process (S100), the print process (S200), and the scribing process (S300) may be implemented as follows. The mounting process (S100), the print process (S200), and the scribing process (S300) may be implemented to approximately match descriptions of the method of manufacturing a solar cell according to the first embodiment of the present invention described above, and thus, a portion having a difference will be mainly described below.

Referring to FIGS. 3B to 8B, in the scribing process (S300), a process of forming the plurality of cell division parts 30 may be performed by moving the scribing apparatus 3 along the first axial direction. In this case, a scribing transport means (not shown) for moving the scribing apparatuses 3 may be installed. The first axial direction may be a direction vertical to a direction in which a laser is irradiated onto the cell 1. For example, in a case which desires to form four cell division parts 30 in the cell 1 by using two scribing apparatuses 3, a process of forming the plurality of cell division parts 30 may be performed as follows. First, two cell division parts 30 are formed at a right portion with respect to a middle point of the cell 1 by using the scribing apparatuses 3 and 3'. Subsequently, the scribing apparatus 3 may move along the first axial direction by using the scribing transport means. Subsequently, two cell division parts 30 are formed at a left portion with respect to the middle point of the cell 1 by using the scribing apparatuses 3 and 3'. Through the above-described process, a process of forming the plurality of cell division parts 30 in the cell 1 may be performed.

Referring to FIGS. 3B to 8B, the print process (S200) may use a material, such as a transparent conductive film (TCF) having conductivity, as the conductive material 20. The print region and the scribing region may be disposed in different regions of the cell 1. The print process (S200) and the scribing process (S300) may be performed simultaneously.

A process of printing a plurality of conductive materials 20 onto the cell 1 may be performed by moving the conductive material printer 2 along the first axial direction. In this case, a print transport means (not shown) for moving the conductive material printer 2 may be installed. For example, in a case which desires to print four conductive materials 20 onto the cell 1 by using two conductive material printers 2, a process of printing the plurality of conductive materials 20 may be performed as follows. First, two conductive materials 20 are printed onto the left portion with respect to the middle point of the cell 1 by using the conductive material printer 2. Subsequently, the conductive material printers 2 may move in the first axial direction by using the print transport means. Subsequently, two conductive materials 20 are printed onto the right portion with respect to the middle point of the cell 1 by using the two conductive material printers 2. Through the above-described process, a process of printing the plurality of conductive materials 20 onto the cell 1 may be performed.

The print process (S200) and the scribing process (S300) may be performed in the same space. That is, the print process (S200) and the scribing process (S300) may all be performed in the processing space.

The print process (S200) and the scribing process (S300) may be performed at positions apart from each other with respect to the first axial direction. Hereinafter, an embodiment where the print process (S200) and the scribing process (S300) are performed in the method of manufacturing a solar cell according to the second embodiment of the present invention will be described with reference to the accompanying drawings. For convenience of understanding, an example where the print process (S200) is performed by four conductive material printers 2, 2', 2", and 2'" and the scribing process (S300) is performed by four scribing apparatuses 3, 3', 3", and 3'" will be described below.

First, the cell 1 is prepared. Two conductive material printers 2 and 2' may be disposed in an upward direction of the cell 1, and two scribing apparatuses 3 and 3' may be disposed in a downward direction of the cell 1. In this case, the conductive material printers 2 and 2' may be disposed at a left portion with respect to the middle point of the cell 1 and the scribing apparatuses 3 and 3' may be disposed at a right portion with respect to the middle point of the cell 1, so that the conductive material printers 2 and 2' and the scribing apparatuses 3 and 3' are disposed apart from one another with respect to the first axial direction.

Subsequently, the print process (S200) and the scribing process (S300) may be performed simultaneously. In the embodiment, as illustrated in FIG. 8A, the print process (S200) and the scribing process (S300) may be performed by the conductive material printers 2 and 2' printing the conductive materials 20 and 20' onto the top surface 1a of the cell 1 and by the scribing apparatuses 3 and 3' forming the cell division parts 30 and 30' on the bottom surface 1b of the cell 1. In this case, the conductive material printers 2 and 2' and the scribing apparatuses 3 and 3' may be disposed apart from one another with respect to the first axial direction, thereby preventing the conductive materials 20 and 20' from being cured by a laser.

Subsequently, a process of moving the cell 1 along the first axial direction may be performed. The process of moving the cell 1 may be performed by a cell moving means (not shown). In this case, the conductive material printers 2" and 2'" may be disposed at a right portion with respect to the middle point of the cell 1, and the scribing apparatuses 3" and 3'" may be disposed at a left portion with respect to the middle point of the cell 1

Subsequently, the print process (S200) and the scribing process (S300) may be performed simultaneously. In the embodiment, as illustrated in FIG. 8B, the print process (S200) and the scribing process (S300) may be performed by the conductive material printers 2" and 2'" printing the conductive materials 20" and 20'" onto the top surface 1a of the cell 1 and by the scribing apparatuses 3" and 3'" forming the cell division parts 30" and 30'" on the bottom surface 1b of the cell 1. In this case, the conductive material printers 2" and 2'" and the scribing apparatuses 3" and 3'" may be disposed apart from one another with respect to the first axial direction, thereby preventing the conductive materials 20" and 20'" from being cured by a laser.

As described above, the method of manufacturing a solar cell according to the second embodiment of the present invention may be implemented so that the scribing process (S300) and the print process (S200) are simultaneously performed in a state where the scribing apparatuses 3 are separated from the conductive material printers 2.

Referring to FIGS. 3B to 8B, the method of manufacturing a solar cell according to the second embodiment of the present invention may include the cutting process (S400) and the bonding process (S500). The cutting process (S400) and the bonding process (S500) may be implemented to approximately match descriptions of the method of manufacturing a solar cell according to the first embodiment of the present invention described above, and thus, their detailed descriptions are omitted.

Third Embodiment

Referring to FIGS. 9 to 15E, a method of manufacturing a solar cell according to a third embodiment of the present invention may include a mounting process (S100) of mounting a cell 1, where a plurality of thin film layers are formed, in a processing space for manufacturing a solar cell, a scribing process (S300) of irradiating a laser onto the cell 1 to form "N−1" (where N is an integer of 3 or more) number of cell division parts 30 for dividing the cell 1 into N number of unit cells 10, a print process (S200) of printing a conductive material 20 onto the cell 1, a cutting process (S400) of dividing the cell 1 into two unit cells 10, and a bonding process (S500) which is successively performed immediately after the cutting process (S400), for bonding two divided unit cells 10.

The method of manufacturing a solar cell according to the third embodiment of the present invention is implemented so that the cutting process (S400) and the bonding process (S500) are repeatedly performed "N−1" times. Therefore, the method of manufacturing a solar cell according to the third embodiment of the present invention is implemented so that the cutting process (S400) divides the cell 1 into the N unit cells 10, and then, the bonding process (S500) is performed. Comparing with the related art, a time taken in the bonding process (S500) may decrease. This will be described below in detail with reference to the accompanying drawings. For convenience of understanding, an example which divides the cell 1 into five unit cells 10, 10', 10", 10''', and 10'''' will be described below.

Figure 13A:
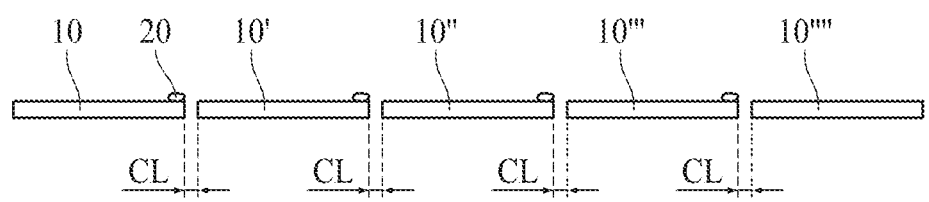
FIGS. 13A to 13E are schematic process side views of a cutting process and a bonding process in a method of manufacturing a solar cell according to the related art.

FIGS. 13A to 13E are process side views of a cutting process (S400) and a bonding process (S500) in a method of manufacturing a solar cell according to the related art. As illustrated in FIG. 13A, a four-time cutting process (S400) may be simultaneously performed for dividing the cell 1 into five unit cells 10, 10', 10", 10''', and 10''''. As the four-time cutting process (S400) is simultaneously performed on the cell 1, the five unit cells 10, 10', 10", 10''', and 10'''' may be apart from one another by a cutting distance CL. Here, four cutting distances CL between the five unit cells 10, 10', 10", 10''', and 10'''' may be the same.

Figure 13B:
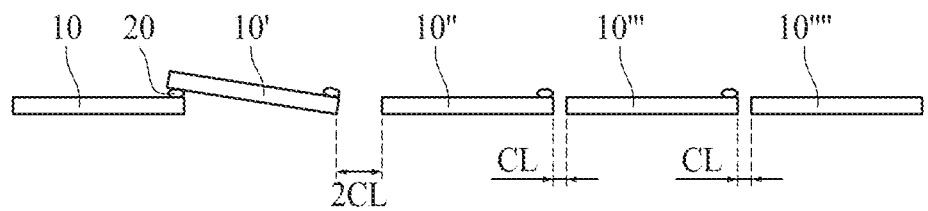
Figure 13C:
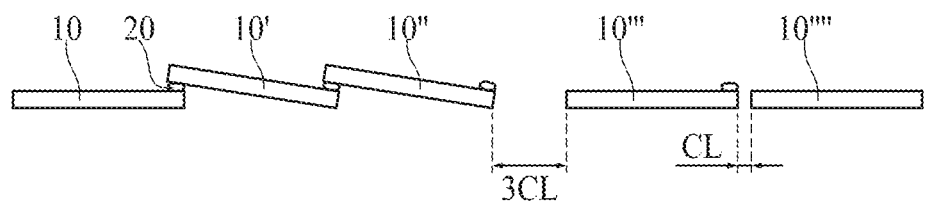
Figure 13D:
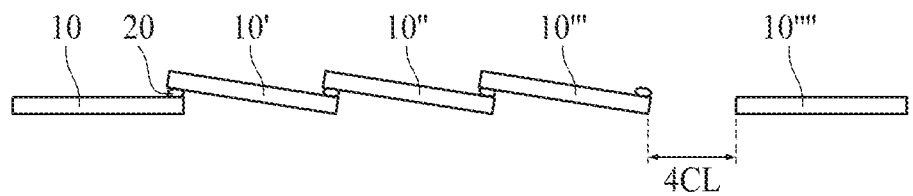
Figure 13E:
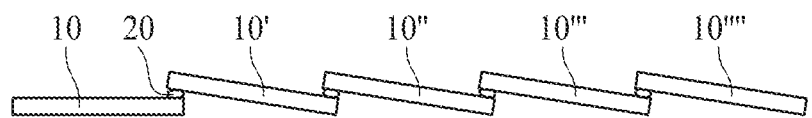

Referring to FIGS. 13B to 13E, after the cutting process (S400) is performed, a four-time bonding process (S500) may be performed for bonding the five unit cells 10, 10', 10", 10''', and 10''''. First, as illustrated in FIG. 13B, as the bonding process (S500) is performed, a second unit cell 10' may be bonded to a first unit cell 10. In this case, the bonding process (S500) may include a process of moving the second unit cell 10' by about one cutting distance CL. Subsequently, as illustrated in FIG. 13C, as the bonding process (S500) is performed, a third unit cell 10" may be bonded to a second unit cell 10'. In this case, the bonding process (S500) may include a process of moving the third unit cell 10" by about two cutting distances CL. This is because the process of moving the second unit cell 10' by one cutting distance CL is performed in a state where the second unit cell 10' is apart from the third unit cell 10", and thus, the third unit cell 10" should further move by one cutting distance CL by which the second unit cell 10' has moved. Subsequently, as illustrated in FIG. 13D, as the bonding process (S500) is performed, a fourth unit cell 10''' may be bonded to the third unit cell 10". In this case, the bonding process (S500) may include a process of moving the fourth unit cell 10''' by about three cutting distances 3CL. This is because the process of moving the third unit cell 10" by two cutting distances 2CL is performed in a state where the third unit cell 10" is apart from the fourth unit cell 10''', and thus, the fourth unit cell 10''' should further move by two cutting distances 2CL by which the third unit cell 10" has moved. Subsequently, as illustrated in FIG. 13E, as the bonding process (S500) is performed, a fifth unit cell 10'''' may be bonded to the fourth unit cell 10'''. In this case, the bonding process (S500) may include a process of moving the fifth unit cell 10'''' by about four cutting distances 4CL. This is because the process of moving the fourth unit cell 10''' by three cutting distances 3CL is performed in a state where the fourth unit cell 10''' is apart from the fifth unit cell 10'''', and thus, the fifth unit cell 10'''' should further move by three cutting distances 3CL by which the fourth unit cell 10''' has moved. As described above, a comparative example may include a process of moving the five unit cells 10, 10', 10", 10''', and 10'''' by about ten cutting distances "10CL=CL+2CL+3CL+4CL".

FIGS. 14A to 14H are process side views of a cutting process (S400) and a bonding process (S500) in a method of manufacturing a solar cell according to a third embodiment of the present invention. In the method of manufacturing a solar cell according to the third embodiment of the present invention, unlike the comparative example, the cutting process (S400) is not simultaneously performed for dividing the cell 1 into five unit cells 10, 10', 10", 10''', and 10''''. That is, the method of manufacturing a solar cell according to the third embodiment of the present invention is implemented so that, when a one-time cutting process (S400) is performed, a one-time bonding process (S500) is performed sequentially and successively. Hereinafter, the cutting process (S400) and the bonding process (S500) of the method of manufacturing a solar cell according to the third embodiment of the present invention will be described.

Figure 14A:
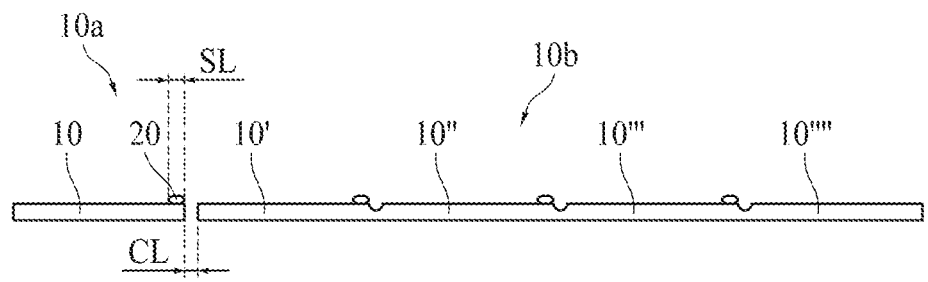
FIGS. 14A to 14H are schematic process side views of a cutting process and a bonding process in a method of manufacturing a solar cell according to a third embodiment of the present invention.

Referring to FIG. 14A, first, a one-time cutting process (S400) of dividing a first unit cell 10 and a second unit cell 10' in the cell 1 is performed. In this case, the first unit cell 10 and the second unit cell 10' may be apart from each other by the cutting distance CL.

Figure 14B:
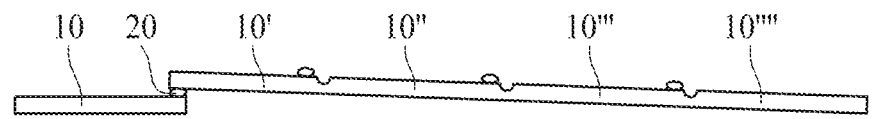

Subsequently, as illustrated in FIG. 14B, as the bonding process (S500) is performed, a second unit cell 10' may be bonded to a first unit cell 10. In this case, the bonding process (S500) may include a process of moving the second unit cell 10' by about the cutting distance CL.

Figure 14C:
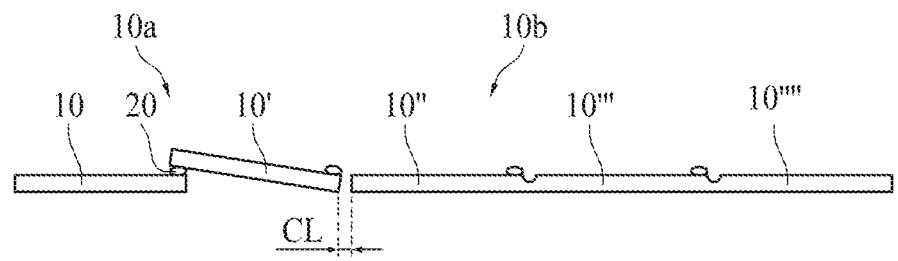

Subsequently, as illustrated in FIG. 14C, a one-time cutting process (S400) of dividing the second unit cell 10' and a third unit cell 10" is performed. In this case, the second unit cell 10' and the third unit cell 10" may be apart from each other by the cutting distance CL.

Figure 14D:
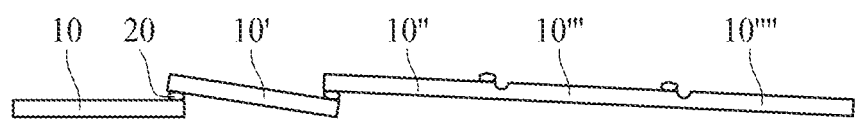

Subsequently, as illustrated in FIG. 14D, as the bonding process (S500) is performed, the third unit cell 10" may be bonded to the second unit cell 10'. In this case, the bonding process (S500) may include a process of moving the third unit cell 10" by about the cutting distance CL. The method of manufacturing a solar cell according to the third embodiment of the present invention is implemented so that, in the bonding process (S500) of bonding the second unit cell 10' to the first unit cell 10, as the second unit cell 10' moves to the first unit cell 10, the third unit cell 10" moves together. Therefore, comparing with the comparative example, the method of manufacturing a solar cell according to the third embodiment of the present invention may decrease a movement distance needed for bonding the third unit cell 10".

Figure 14E:
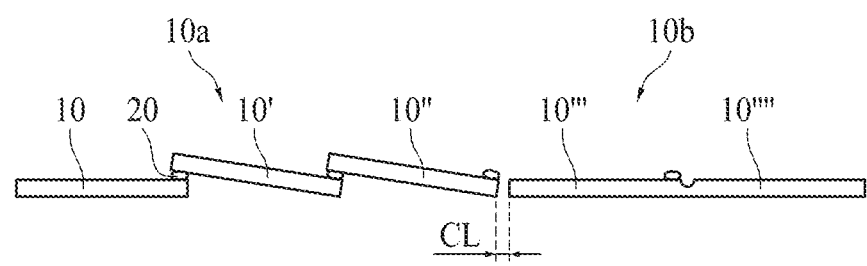

Subsequently, as illustrated in FIG. 14E, a one-time cutting process (S400) of dividing the third unit cell 10" and a fourth unit cell 10''' is performed. In this case, the fourth unit cell 10''' and the third unit cell 10" may be apart from each other by the cutting distance CL.

Figure 14F:
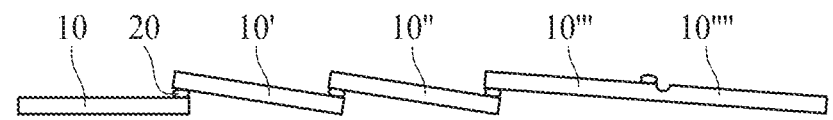

Subsequently, as illustrated in FIG. 14F, as the bonding process (S500) is performed, the fourth unit cell 10''' may be bonded to the third unit cell 10". In this case, the bonding process (S500) may include a process of moving the fourth unit cell 10''' by about the cutting distance CL. The method of manufacturing a solar cell according to the third embodiment of the present invention is implemented so that, in the bonding process (S500) of bonding the third unit cell 10" to the second unit cell 10', as the third unit cell 10" moves to the second unit cell 10', the fourth unit cell 10'" moves together. Therefore, comparing with the comparative example, the method of manufacturing a solar cell according to the third embodiment of the present invention may decrease a movement distance needed for bonding the fourth unit cell 10'".

Figure 14G:
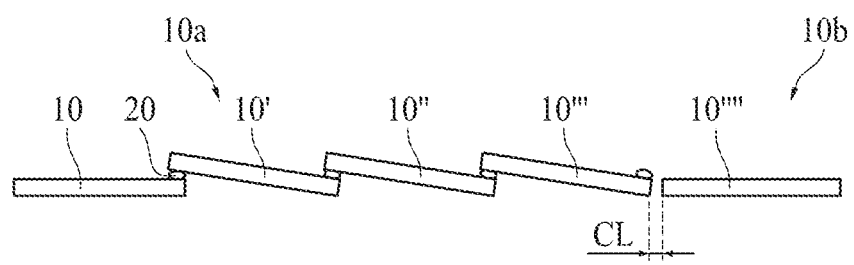

Subsequently, as illustrated in FIG. 14G, a one-time cutting process (S400) of dividing the fourth unit cell 10'" and a fifth unit cell 10"" is performed. In this case, the fifth unit cell 10"" and fourth unit cell 10'" may be apart from each other by the cutting distance CL.

Figure 14H:
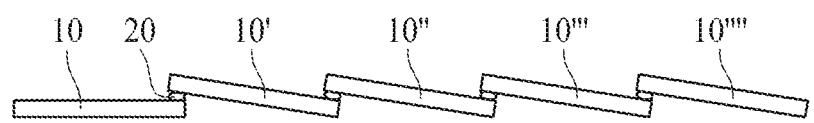

Subsequently, as illustrated in FIG. 14H, as the bonding process (S500) is performed, the fifth unit cell 10"" may be bonded to the fourth unit cell 10'". In this case, the bonding process (S500) may include a process of moving the fifth unit cell 10"" by about the cutting distance CL. The method of manufacturing a solar cell according to the third embodiment of the present invention is implemented so that, in the bonding process (S500) of bonding the fourth unit cell 10'" to the third unit cell 10", as the fourth unit cell 10'" moves to the third unit cell 10", the fifth unit cell 10"" moves together. Therefore, comparing with the comparative example, the method of manufacturing a solar cell according to the third embodiment of the present invention may decrease a movement distance needed for bonding the fifth unit cell 10"".

In this manner, the method of manufacturing a solar cell according to the third embodiment of the present invention may include a process of moving, by four cutting distances 4CL, five unit cells 10, 10', 10", 10'", and 10"" which are divided in the bonding process (S500).

As described above, the method of manufacturing a solar cell according to the third embodiment of the present invention is implemented so that a one-time bonding process (S500) is successively performed immediately after a one-time cutting process (S400) is performed on the cell 1, and each of the cutting process (S400) and the bonding process (S500) is repeatedly performed "N−1" times. Therefore, comparing with the comparative example, the method of manufacturing a solar cell according to the third embodiment of the present invention is implemented so that movement distances of the unit cells 10 divided in the bonding process (S500) are reduced despite that a same number of cutting processes (S400) and a same number of bonding processes (S500) are performed. Therefore, the method of manufacturing a solar cell according to the third embodiment of the present invention may decrease a time taken in the bonding process (S500), thereby enhancing a productivity of a solar cell.

Hereinafter, the mounting process (S100), the scribing process (S300), the print process (S200), the cutting process (S400), and the bonding process (S500) will be described in detail with reference to the accompanying drawings.

Figure 9:
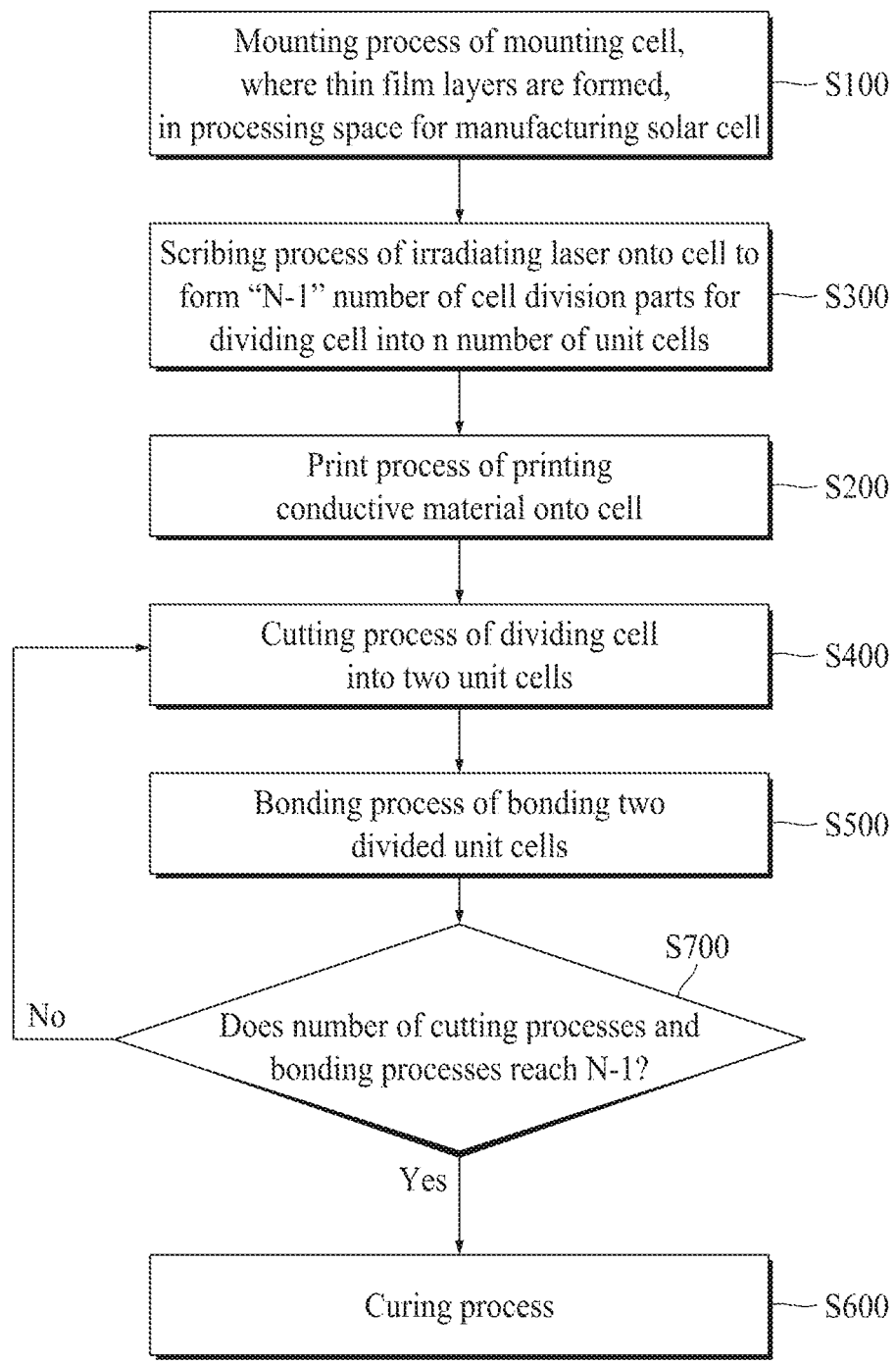
FIG. 9 is a schematic flowchart of a method of manufacturing a solar cell according to a third embodiment of the present invention.
Figure 10:
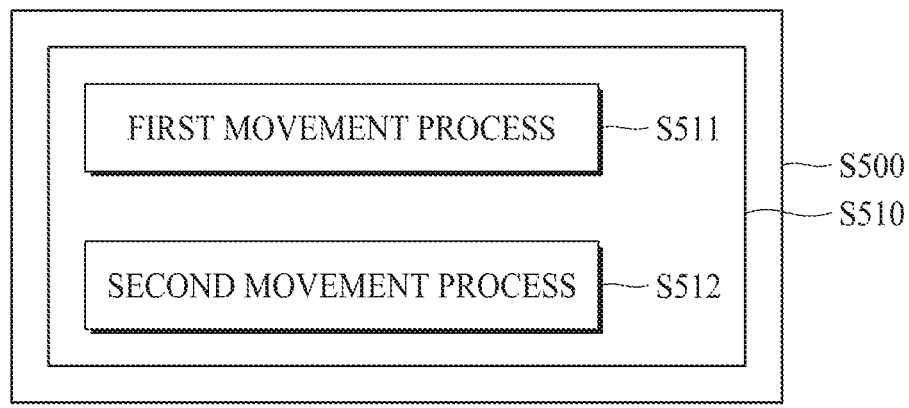
FIG. 10 is a schematic block diagram of a bonding process in a method of manufacturing a solar cell according to a third embodiment of the present invention.

Referring to FIG. 9, the mounting process (S100) may be a process of mounting the cell 1 in the processing space for manufacturing a solar cell. The mounting process (S100) may be a process of preparing a substrate, where the solar cell is provided, in the processing space. Here, the solar cell may be the cell 1 where a plurality of thin film layers are stacked on the substrate. The mounting process may be performed by a loading apparatus (not shown) which loads the cell into the processing space. The processing space may accommodate a manufacturing apparatus (not shown) needed for manufacturing the solar cell therein and may be wholly implemented as a chamber.

Figure 11:
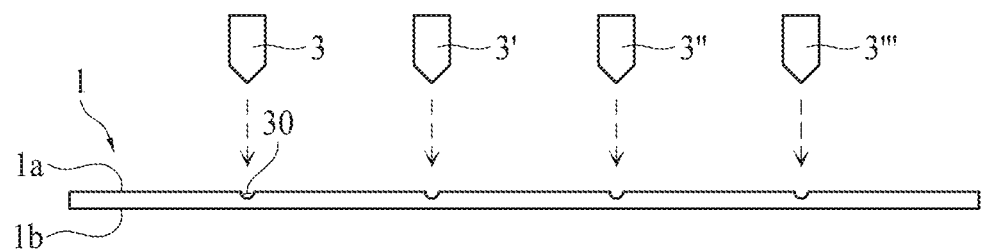
FIG. 11 is a schematic process side view of a scribing process in a method of manufacturing a solar cell according to a third embodiment of the present invention.

Referring to FIGS. 9 and 11, the scribing process (S300) may be a process for dividing the cell 1 into a plurality of unit cells 10. The scribing process (S300) may be performed after the mounting process (S100). The scribing process (S300) may be performed by a scribing apparatus 3 which irradiates a laser toward the cell 1. The scribing apparatus 3 may irradiate the laser onto a scribing region which is one region of the cell 1. The scribing region and the print region may be disposed in different regions of the cell 1. An arrow illustrated as a one-dot-dashed line in FIG. 11 schematically illustrates the laser irradiated by the scribing apparatus 3. In FIG. 11, it is illustrated that the scribing process (S300) is performed on the top surface 1a of the cell 1, but this is merely an example and the scribing process (S300) may be performed on the bottom surface 1b of the cell 1.

The scribing process (S300) may be a process of forming "N−1" number of cell division parts 30 for dividing the cell 1 into N number of unit cells 10. In this case, the scribing process (S300) may be performed by the "N−1" scribing apparatuses 3. For example, as illustrated in FIG. 11, in case which desires to divide five unit cells 10, the scribing process (S300) may be performed by four scribing apparatuses 3, 3', 3", and 3'". Therefore, when a first scribing apparatus 3 irradiates a laser onto a first scribing region of the cell 1, a second scribing apparatus 3' may irradiate a laser onto a second scribing region apart from the first scribing region, a third scribing apparatus 3" may irradiate a laser onto a third scribing region apart from each of the first scribing region and the second scribing region, and a fourth scribing apparatus 3'" may irradiate a laser onto a fourth scribing region apart from each of the first scribing region, the second scribing region, and the third scribing region. In this case, the scribing apparatuses 3, 3', 3", and 3'" may be disposed apart from one another by a certain interval. Therefore, the method of manufacturing a solar cell according to the third embodiment of the present invention may be implemented so that the scribing process (S300) is simultaneously performed on a whole surface of the cell 1. Accordingly, the method of manufacturing a solar cell according to the third embodiment of the present invention may decrease a time taken in the scribing process (S300). The first scribing region, the second scribing region, the third scribing region, and the fourth scribing region may be one regions of the top surface 1a of the cell 1.

The scribing process (S300) may be performed by irradiating the laser toward the cell 1. Therefore, by removing a certain region of the cell 1, the cell division part 30 may be formed. As the scribing process (S300) is performed, the cell division part 30 may be formed on one surface of the cell 1. As the scribing process (S300) is performed, the cell division part 30 may be formed on one surface of the substrate. The cell division part 30 may be implemented as a groove which is recessed from a surface of the cell 1 by a certain depth. The cell division part 30 may be formed to extend from one side of the cell 1 to the other side of the cell 1.

Figure 12:
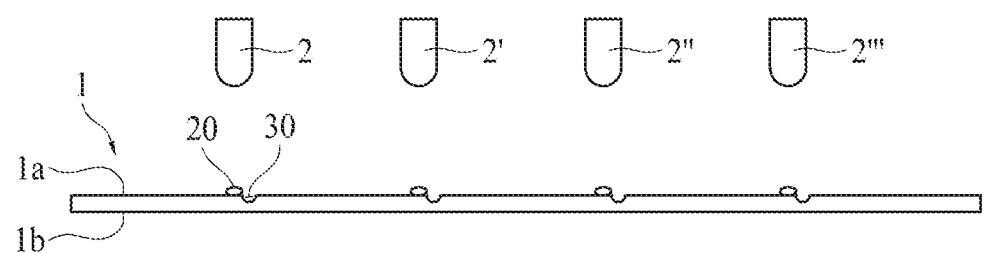
FIG. 12 is a schematic process side view of a print process in a method of manufacturing a solar cell according to a third embodiment of the present invention.

Referring to FIGS. 9 and 12, the print process (S200) may be a process of printing a conductive material 20 onto the cell 1. As the print process (S200) is performed, the conductive material 20 may be printed onto a periphery of the cell division part 30. The print process (S200) may be performed after the scribing process (S300). The conductive material 20 may be a material, having conductivity, such as a transparent conductive film (TCF). The print process (S200) may be performed by a conductive material printer 2 which prints the conductive material 20. The conductive material printer 2 may print the conductive material 20 onto a print region which is one region of the cell 1. The print region and the scribing region may be disposed in different regions of the cell 1. In FIG. 12, it is illustrated that the print process (S200) is performed on the top surface 1*a* of the cell 1, but this is merely an example and the print process (S200) may be performed on the bottom surface 1*b* of the cell 1.

The print process (S200) may include a process of printing a plurality of conductive materials 20 onto the cell 1 by using a plurality of conductive material printers 2. In a case which desires to divide the cell 1 into N number of unit cells 10, the print process (S200) may be performed by "N−1" number of conductive material printers 2. For example, as illustrated in FIG. 12, in case which desires to divide the cell 1 to five unit cells 10, the print process (S200) may be performed by four conductive material printers 2, 2', 2", and 2'". Therefore, when a first conductive material printer 2 prints the conductive material 20 onto a first print region of the cell 1, a second conductive material printer 2' may print the conductive material 20 onto a second print region apart from the first print region, a third conductive material printer 2" may print the conductive material 20 onto a third print region apart from each of the first print region and the second print region, and a fourth conductive material printer 2'" may print the conductive material 20 onto a fourth print region apart from each of the first print region, the second print region, and the third print region. In this case, the conductive material printers 2, 2', 2", and 2'" may be disposed apart from one another by a certain interval. Therefore, the method of manufacturing a solar cell according to the third embodiment of the present invention may be implemented so that the print process (S200) is performed on a whole surface of the cell 1. Accordingly, the method of manufacturing a solar cell according to the third embodiment of the present invention may decrease a time taken in the print process (S200). The first print region, the second print region, the third print region, and the fourth print region may be one regions of the top surface 1*a* of the cell 1.

The print process (S200) and the scribing process (S300) may be performed on different surfaces of the cell 1. For example, the print process (S200) may be performed on the top surface 1*a* of the cell 1, and the scribing process (S300) may be performed on the bottom surface 1*b* of the cell 1. Accordingly, the method of manufacturing a solar cell according to the first embodiment of the present invention may separate a surface, where the print process (S200) is performed, from a surface where the scribing process (S300) is performed, thereby implementing a restraint force for restraining that the conductive material 20 is cured due to the temperature of the laser.

Referring to FIGS. 9 and 14A to 14H, the cutting process (S400) is a process of dividing the cell 1 into two unit cells 10. That is, as the cutting process (S400) is performed, the substrate configuring the cell 1 may be divided into two pieces along one cell division part 30 of the "N−1" cell division parts 30. As the cutting process (S400) is performed, the cell 1 may be divided into two unit cells 10 with respect to the cell division part 30. The cutting process (S400) may be performed by a cutting robot (not shown) which divides the cell 1 into two unit cells 10. When the "N−1" cell division parts 30 are formed in the cell 1, the cutting process (S400) may be performed "N−1" times.

Referring to FIGS. 9 and 14A to 14H, as the cutting process (S400) is performed, a cutting distance CL may be formed between two divided unit cells 10. That is, as the cutting process (S400) is performed, two divided pieces may be apart from each other by the cutting distance CL. In this case, the bonding process (S500) may include a process of moving divided unit cells 10.

A cutting distance CL formed by repeatedly performing the cutting process (S400) may be progressively reduced. For example, a cutting distance CL formed by repeatedly performing a one-time cutting process (S400) as illustrated in FIG. 14A may be greater than a cutting distance CL formed by repeatedly performing a two-time cutting process (S400) as illustrated in FIG. 14C. In this manner, the method of manufacturing a solar cell according to the third embodiment of the present invention may be implemented so that a cutting distance CL formed by repeatedly performing the cutting process (S400) is progressively reduced, thereby decreasing a movement distance for bonding the unit cells 10 in the bonding process (S500). Accordingly, the method of manufacturing a solar cell according to the third embodiment of the present invention may decrease a time taken in the bonding process (S500). Cutting distances CL formed by repeatedly performing the cutting process (S400) may be the same.

Referring to FIGS. 9 and 14A to 14H, the bonding process (S500) is a process of bonding divided unit cells 10. That is, the bonding process (S500) is a process of bonding two divided pieces. The bonding process (S500) may be successively performed immediately after the one-time cutting process (S400), for bonding two divided unit cells 10, and the bonding process (S500) and the cutting process (S400) may be repeatedly performed "N−1" times. Accordingly, comparing with the related art which is implemented to perform the bonding process (S500) after the cell 1 is divided into a plurality of unit cells 10 in the cutting process (S400), the method of manufacturing a solar cell according to the third embodiment of the present invention may decrease a time taken in the bonding process (S500).

The bonding process (S500) may be performed by bonding two divided unit cells 10 by using the conductive material 20. The bonding process (S500) may be performed a plurality of time s which are the same as the cutting process (S400). For example, as illustrated in FIGS. 14A to 14F, the cutting process (S400) is performed three times, the bonding process (S500) may also be performed three times.

The bonding process (S500) may include a process of moving one unit cell 10 of two divided unit cells 10. That is, the bonding process (S500) may include a process of moving one piece of two divided pieces to overlap a portion of the other piece. Here, a portion where the two pieces overlap may be a print distance SL (illustrated in FIG. 14A) which is a length of the conductive material 20 printed onto the cell 1. The bonding process (S500) may be performed by a transport robot (not shown) which moves the unit cell 10.

The bonding process (S500) may include a process of moving only one unit cell 10 of two divided unit cells 10. Therefore, comparing with the comparative example which moves all of the unit cells 10 in the bonding process (S500), the easiness of an operation of moving the unit cell 10 may be enhanced.

Referring to FIGS. 10 and 14A to 14H, the bonding process (S500) may include a movement process (S510) of moving a movement cell 10*b* to a fixed cell 10*a*. As the movement process (S510) is performed, the movement cell 10*b* may move to the fixed cell 10*a*. The fixed cell 10*a* may be a fixed unit cell 10, which does not move in the bonding process (S500), of the divided unit cells 10. The movement cell 10*b* may be a unit cell 10, which moves in the bonding process (S500), of the divided unit cells 10. The movement process (S510) may be performed by the transport robot.

The movement process (S510) may include a first movement process (S511) and a second movement process (S512).

The first movement process (S511) may be a process of moving the movement cell 10b along a first axial direction. The first axial direction may be a direction parallel to a direction in which a laser is irradiated. As the first movement process (S511) is performed, the movement cell 10b may be disposed in an upward direction with respect to the fixed cell 10a.

The second movement process (S512) may be a process of moving the movement cell 10b along a second axial direction. The second axial direction may be a direction vertical to the first axial direction. As the second movement process (S512) is performed, the movement cell 10b may move by the cutting distance CL and a print distance SL (illustrated in FIG. 14A). The print distance SL may be a length of a conductive material 20 printed onto the cell 1 with respect to the second axial direction. The second movement process (S512) may be performed sequentially after the first movement process (S511) is performed.

The second movement process (S512) and the first movement process (S511) may be performed simultaneously. Accordingly, the method of manufacturing a solar cell according to the third embodiment of the present invention may decrease a time taken in moving the movement cell 10b.

The second movement process (S512) may be implemented to be performed prior to the first movement process (S511). In this case, the second movement process (S512) may be performed so that the movement cell 10b does not move by more than the cutting distance CL. Therefore, the method of manufacturing a solar cell according to the third embodiment of the present invention may prevent a possibility of damages of the movement cell 10b and the fixed cell 10a caused by a collision between the movement cell 10b and the fixed cell 10a. The method of manufacturing a solar cell according to the third embodiment of the present invention may move the movement cell 10b by the cutting distance CL, thereby enhancing the efficiency of the bonding process (S500).

Referring to FIGS. 9 and 14A to 14H, the method of manufacturing a solar cell according to the third embodiment of the present invention may further include a determination process (S700).

The determination process (S700) determines whether a number of times each of the cutting process (S400) and the bonding process (S500) is performed reaches "N-1" times. The determination process (S700) may be performed by a controller (not shown) which counts a number of times each of the cutting process (S400) and the bonding process (S500) is performed. When it is determined by the controller that the repetition process is less than "N-1" times, the controller may provide a process signal to the cutting robot (not shown) and the transport robot (not shown) so that the cutting process (S400) and the bonding process (S500) are performed. When it is determined by the controller that the repetition process is "N-1" times, the controller may not provide the process signal to the cutting robot and the transport robot so that the cutting process (S400) and the bonding process (S500) are no longer performed.

Referring to FIGS. 9 and 14H, the method of manufacturing a solar cell according to the third embodiment of the present invention may further include a curing process (S600).

The curing process (S600) is a process of curing bonded unit cells 10. The curing process (S600) may be performed after the determination process (S700). That is, the curing process (S600) may be performed after an (N-1)-time cutting process (S400) and an (N-1)-time bonding process (S500) are completed. The curing process (S600) may be performed by a heating apparatus (not shown) which heats the bonded unit cells 10. As the curing process (S600) is performed, a solar cell 100 having a module type where N number of unit cells 10 are connected to one another may be manufactured. In FIG. 14H, it is illustrated that the solar cell 100 is configured with five unit cells 10, but this is merely an example and the solar cell 100 may be configured with one or more and four or less unit cells 10 or may be configured with six or more unit cells 10.

Referring to FIGS. 15A to 15E, a method of manufacturing a solar cell according to an embodiment of the present invention may include a module process.

The module process is a process of additionally coupling a connection module, configured with M (where M is an integer of 2 or more) number of unit module cells 11 (illustrated in FIG. 15A), to a cell (hereinafter referred to as a "base module") on which the mounting process (S100), the print process (S200), the scribing process (S300), an "N-1"-time cutting process (S400), and an "N-1"-time bonding process (S500). For example, as illustrated in FIG. 15D, the module process may be a process of additionally coupling a connection module, where five unit module cells 11, 11', 11", 11''', and 11"" are connected to one another, to the base module where five unit cells 10, 10', 10", 10''', and 10"" are connected to one another. The module process may be performed in the processing space.

Figure 15A:
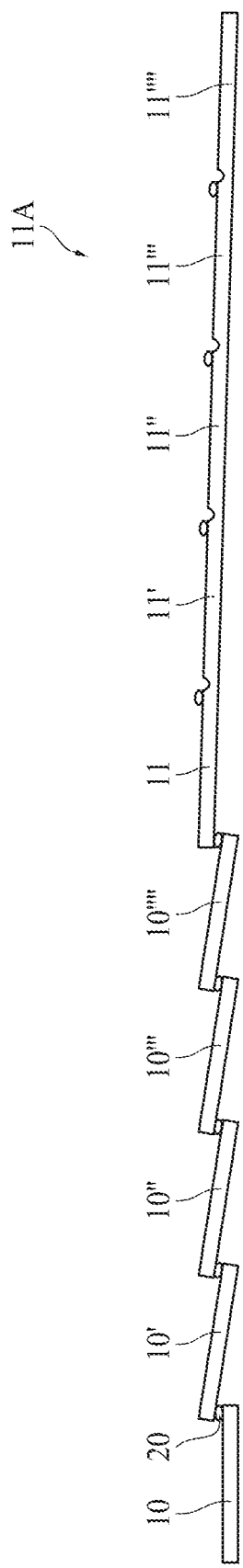
FIGS. 15A to 15E are schematic process side views of a module process in a method of manufacturing a solar cell according to a third embodiment of the present invention.

Referring to FIG. 15A, the module process may include a connection process.

The connection process may be a process of connecting a connection cell 11A, where a plurality of thin film layers are formed, to the base module. The connection process may be performed by printing the conductive material 20 onto the base module and then bonding the base module to the conductive material 20. The connection cell 11A may be manufactured by the cell manufacturing process. Therefore, the connection cell 11A may be implemented to be approximately equal to the cell 1. The connection process may be performed after each of the cutting process (S400) and the bonding process (S500) is performed "N-1" times. The connection process may be performed by the transport robot.

The module process may include a module scribing process and a module print process.

The module scribing process is a process of forming "M-1" number of cell division parts for dividing the connection cell 11A into M (where M is an integer of 2 or more) number of unit module cells 11. Here, the unit module cell 11 may be implemented to be approximately equal to the unit cell 10. The module scribing process may be implemented to be approximately equal to the scribing process (S300).

The module print process is a process of printing the conductive material 20 onto the connection cell 11A. The module print process may be performed after the module scribing process. The module print process may be implemented to be approximately equal to the print process (S200).

The module print process and the module scribing process may be performed before the connection process. In this case, the cell division part 30 may be formed in the connection cell 11A before the connection process is performed, and the conductive material 20 may be printed onto the connection cell 11A. The module print process and the module scribing process may be performed after the connection process.

Figure 15B:
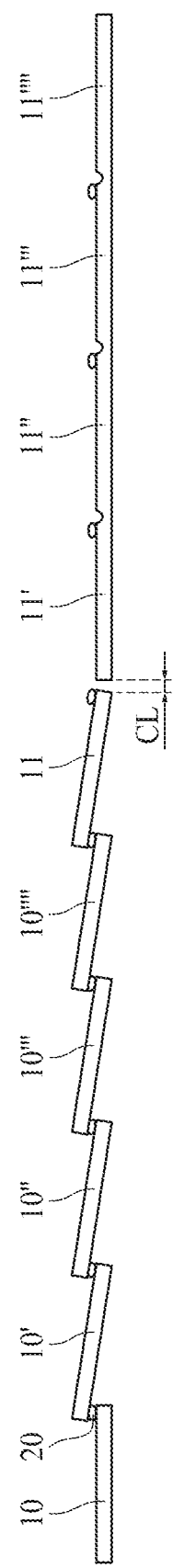

Referring to FIG. 15B, the module process may include a module cutting process.

The module cutting process is for dividing the connection cell 11A into two unit module cells 11. The module cutting process may be performed after the connection process. As the module cutting process is performed, a cutting distance CL between two divided unit module cells 11 may be formed. In a case where "M−1" number of cell division parts are formed on the connection cell 11A, the module cutting process may be performed "M−1" times. The module cutting process may be implemented to be approximately equal to the cutting process (S400).

Figure 15C:
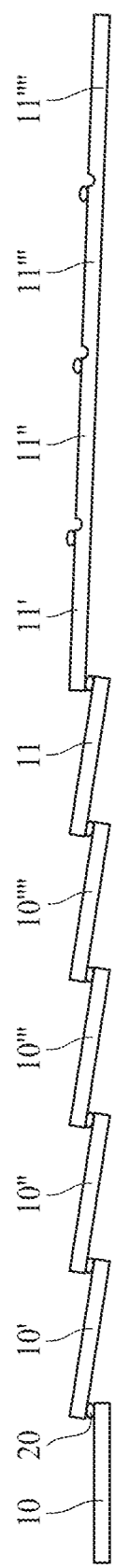
Figure 15D:
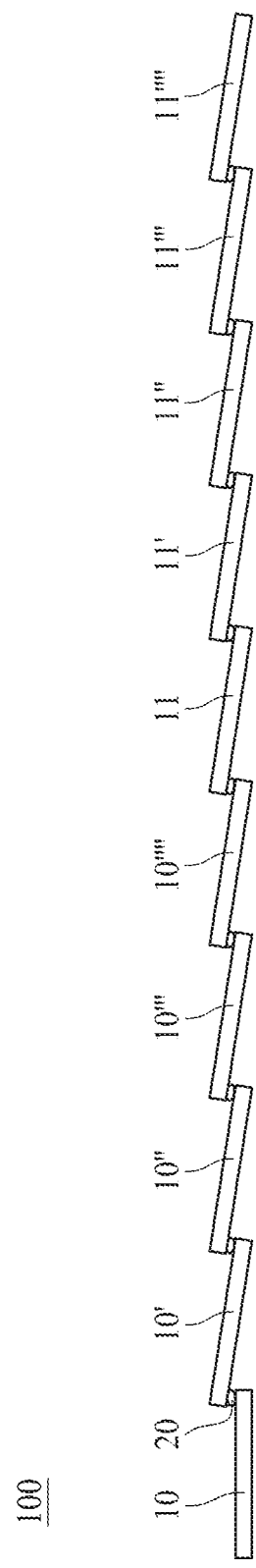

Referring to FIG. 15C, the module process may include a module bonding process.

The module bonding process is a process of bonding two divided unit module cells 11. The module bonding process may be successively performed immediately after the module cutting process, for bonding the two divided unit module cells 11. The module bonding process may be performed a plurality of times which is the same as the module cutting process. The module bonding process may be implemented to be approximately equal to the bonding process (S500).

Referring to FIG. 15D, the module bonding process may be successively performed immediately after a one-time module cutting process, and each of the module bonding process and the module cutting process may be repeatedly performed "M−1" times. Accordingly, comparing with the comparative example which is implemented so that the module bonding process is performed after the connection cell 11A is divided into a plurality of unit module cells 11 in the module cutting process, the method of manufacturing a solar cell according to the third embodiment of the present invention may decrease a time taken in the module bonding process.

Referring to FIG. 15D, when the method of manufacturing a solar cell according to the third embodiment of the present invention includes the module process, the curing process (S600) may be performed after the module process is completed. In this case, the curing process (S600) may cure the base module and the connection module. As the curing process (S600) is performed, a solar cell 100 having a module type where N number of unit cells 10 are connected to M number of unit module cells 11 may be manufactured. FIG. 15D illustrates a solar cell 100 which is configured with five unit cells 10, 10', 10", 10''', and 10'''' and five unit module cells 11, 11', 11", 11''', and 11''''.

Figure 15E:
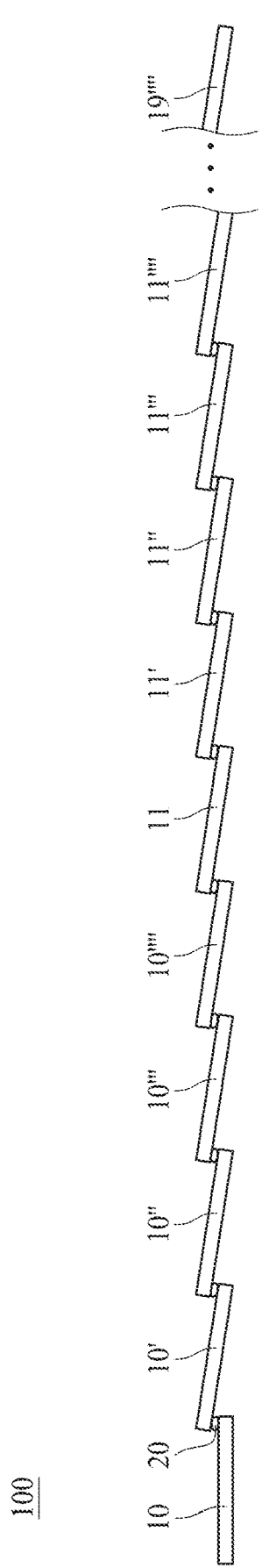

The method of manufacturing a solar cell according to the third embodiment of the present invention may be implemented so that the module process is repeatedly performed. For example, as illustrated in FIG. 15E, nine connection modules may be sequentially coupled to the base module. When each of the connection modules is connected to five unit module cells, the solar cell 100 may be configured with five unit cells 10, 10', 10", 10''', and 10'''' and forty-five unit module cells 11, 11', 11", 11''', 11'''', . . . , and 11'''''. In this case, the curing process (S600) may be performed after the module process is completed.

The present invention described above are not limited to the above-described embodiments and the accompanying drawings and those skilled in the art will clearly appreciate that various modifications, deformations, and substitutions are possible without departing from the scope and spirit of the invention.

The invention claimed is:

1. A method of manufacturing a solar cell, the method comprising:
   a mounting process of mounting a cell, where a plurality of thin film layers are formed, in a processing space for manufacturing a solar cell;
   a print process of printing a conductive material onto the cell; and
   a scribing process of irradiating a laser toward the cell to form a cell division part for dividing the cell into a plurality of unit cells,
   wherein the print process and the scribing process are performed simultaneously.

2. The method of claim 1, wherein the print process and the scribing process are performed on different surfaces of the cell.

3. The method of claim 1, wherein the print process and the scribing process are performed at different positions of the cell.

4. The method of claim 1, wherein
   the print process comprises a process of printing a plurality of conductive materials onto the cell by using a plurality of conductive material printers, and
   the scribing process comprises a process of forming a plurality of cell division parts on the cell by using a plurality of scribing apparatuses.

5. The method of claim 1, further comprising:
   a cutting process of dividing the cell into a plurality of unit cells;
   a bonding process of bonding the divided unit cells; and
   a curing process of curing the bonded unit cells.

6. The method of claim 1, wherein the print process and the scribing process are performed at positions apart from each other with respect to a first axial direction vertical to a direction in which the laser is irradiated.

7. A method of manufacturing a solar cell, the method comprising:
   a mounting process of mounting a cell, where a plurality of thin film layers are formed, in a processing space for manufacturing a solar cell;
   a scribing process of irradiating a laser onto the cell to form "N−1" (where N is an integer of 3 or more) number of cell division parts for dividing the cell into N number of unit cells;
   a print process of printing a conductive material onto the cell;
   a cutting process of dividing the cell into two unit cells; and
   a bonding process successively performed immediately after the cutting process, for bonding the two divided unit cells,
   wherein the cutting process and the bonding process are repeatedly performed.

8. The method of claim 7, wherein the bonding process comprises a process of moving only one unit cell of the two divided unit cells.

9. The method of claim 7, wherein the bonding process comprises a movement process of moving a movement cell of the two divided unit cells to a fixed cell of the two divided unit cells.

10. The method of claim 9, wherein the movement process comprises:
    a first movement process of moving the movement cell along a first axial direction parallel to a direction in which the laser is irradiated; and a second movement process of moving the movement cell along a second axial direction vertical to the first axial direction.

11. The method of claim 10, wherein the second movement process moves the movement cell by a distance obtained by summating a cutting distance, by which the fixed cell is apart from the movement cell, and a print distance by which the conductive material is printed.

12. The method of claim 7, wherein a cutting distance is formed between the two unit cells which are divided as the cutting process is performed.

13. The method of claim 7, further comprising:
a module process of coupling a connection module, configured with M (where M is an integer of 2 or more) number of unit module cells, to the cell on which the mounting process, the scribing process, the print process, an "N−1"-time cutting process, and an "N−1"-time bonding process; and
a curing process of curing the cell and the connection module.

14. A method of manufacturing a solar cell, the method comprising:
a cutting process of dividing a substrate into two pieces along one cell division part of "N−1" (where N is an integer of 3 or more) number of cell division parts for dividing the substrate into N number of unit pieces; and
a bonding process of bonding the two divided pieces,
wherein each of the cutting process and the bonding process is repeatedly performed "N−1" times.

15. The method of claim 14, wherein the bonding process comprises a process of moving one piece of the two divided pieces to overlap a portion of the other piece.

16. The method of claim 14, further comprising:
a mounting process of preparing the substrate with a solar cell formed therein;
a scribing process of forming the "N−1" cell division parts on one surface of the substrate; and
a print process of printing a conductive material onto a periphery of the "N−1" cell division parts,
wherein the mounting process, the scribing process, and the print process are performed before the cutting process.

* * * * *